United States Patent [19]

Yamazaki et al.

[11] Patent Number: 4,499,483

[45] Date of Patent: Feb. 12, 1985

[54] SILICON PHOTODIODE WITH N-TYPE CONTROL LAYER

[75] Inventors: Tsuneo Yamazaki, Pointe Claire; Mervat Faltas, Kirkland; Paul P. Webb, Beaconsfield, all of Canada

[73] Assignee: RCA, Inc., Ste-Anne-de-Bellevue, Canada

[21] Appl. No.: 603,983

[22] Filed: Apr. 26, 1984

Related U.S. Application Data

[63] Continuation of Ser. No. 321,280, Nov. 13, 1981.

[30] Foreign Application Priority Data

Sep. 16, 1981 [CA] Canada ................................ 386011

[51] Int. Cl.[3] .............................................. H01L 27/14
[52] U.S. Cl. ........................................ 357/30; 357/58; 357/91; 357/52
[58] Field of Search .................... 357/30, 30 D, 30 A, 357/30 J, 52, 58, 91, 52 D

[56] References Cited

U.S. PATENT DOCUMENTS 3,378,915  4/1968  Zenner .............................. 357/52 X
3,512,056  5/1970  Chu et al. .......................... 357/52 X

FOREIGN PATENT DOCUMENTS 52-4787  1/1977  Japan ................................ 357/52 D Primary Examiner—Andrew J. James
Assistant Examiner—William A. Mintel
Attorney, Agent, or Firm—Birgit E. Morris; William J. Burke

[57] ABSTRACT

A p-ν-n Si photodiode having an n-type control layer extended into the silicon body from a portion of the surface contiguous to that portion from which a p-type region extends. Photodiodes incorporating this control layer have a much higher junction resistance.

The invention also includes an improved method of making a photodiode which has a reduced number of processing steps. The improvement comprises implanting As or Sb into the surface of a ν-type Si body to form an n-type layer prior to the steps of passivating the surface and forming a p-type region extending into the body from the surface.

6 Claims, 1 Drawing Figure

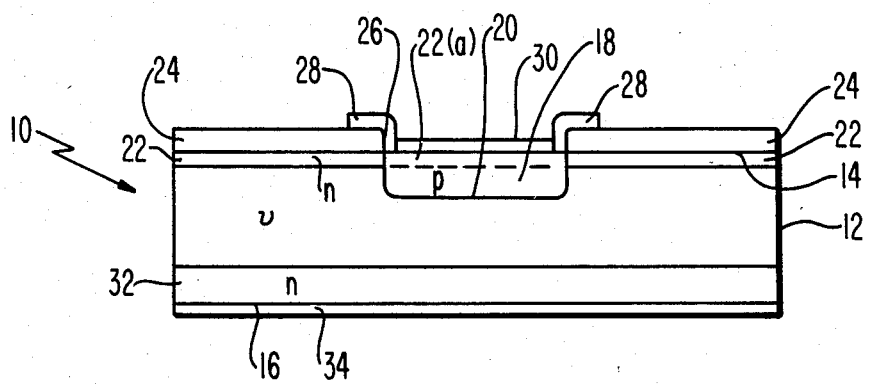

SILICON PHOTODIODE WITH N-TYPE CONTROL LAYER

This is a continuation of application Ser. No. 321,280, filed 11/13/81.

The invention relates to a p-ν-n Si photodiode having an improved junction resistance and a method of making this photodiode.

BACKGROUND OF THE INVENTION

Silicon (Si) photodiodes are commonly used light detectors comprising p- and n-type regions extending a distance into either a π-type or ν-type Si body from opposed surfaces thereof. A p-n junction is formed at the interface between the remainder of the body and the region having opposite conductivity type to that of the body. In the operation of such a photodiode, a reverse bias voltage between the regions of opposite conductivity type creates a depletion region which extends through the body. Photons incident on the photodiode are absorbed creating electron-hole pairs which are swept out of the depleted region thereby generating a detectable electrical current.

In such devices portions of the surfaces are coated with a thermally grown $SiO_2$ passivation layer to reduce the sensitivity of the surface to its ambient. It is well known, however, that the presence of this $SiO_2$ layer induces the formation of an n-type surface channel in an underlying high resistivity π-type Si surface. Mills, in U.S. Pat. No. 4,009,058, has disclosed a n-π-p+ photodiode in which a p-type surface control layer extends into the body from that portion of the surface contiguous with that portion from which the n-type region extends. The presence of this layer prevents the induction of an n-type surface channel by over-compensation and provides a p-n junction with the n-type region at the surface. In a p-ν-n photodiode the presence of an n-type surface channel would enhance the n-type nature of that portion of the surface outside of the p-type region and thus a control layer should not be required.

In Si photodiodes used in a photovoltaic mode a parameter of interest and importance is the junction resistance which is defined as the slope of the V-I curve as it passes through the point $V = I = 0$. The junction resistance can be defined as $$R = (dV/dI)_{V=0} = nkT/qI_o$$

where n is a number between 1 and 2, k is Boltzmann's constant, T is the temperature, q is the electronic charge, and $I_o$ is the junction current at an applied reverse bias voltage greater than a few times kT. For a p-ν-n Si photodiode where the resistivity of the Si body is in excess of about 1000 ohm-cm (Ω-cm), the junction current $I_o$ is large and the corresponding junction resistance is low. We have discovered that a large fraction of the high junction current and corresponding low junction resistance is due to the generation of holes in the n-type surface channel at or near the interface with the passivation layer and the flow of these holes across the p-n junction.

SUMMARY OF THE INVENTION

The invention is a p-ν-n Si photodiode having an n-type control layer extending a distance into the surface of a Si body from that portion of the surface contiguous with that portion from which the p-type region extends. The n-type control layer makes the surface having the n-type channel therein more heavily n-type conducting thereby reducing the surface generation of holes, and thus the junction current $I_o$. The junction resistance is a factor of between 5 and 10 times larger in photodiodes incorporating the n-type control layer.

The invention also includes a method of fabricating the p-ν-n Si photodiode which comprises the steps of implanting an n-type conductivity modifier into a first surface of a ν-type Si body, diffusing a p-type conductivity modifier into a portion of the first surface, and diffusing an n-type conductivity modifier into an opposed second surface of the Si body.

BRIEF DESCRIPTION OF THE DRAWING

The FIGURE is a cross-sectional view of a Si photodiode of the invention.

DETAILED DESCRIPTION OF THE INVENTION

In the FIGURE the photodiode 10 includes a body of ν-type Si 12 having opposed surfaces 14 and 16. A p-type conductivity region 18 extends a distance into the Si body 12 from the surface 14 thereby forming a p-n junction 20 at the interface of the p-type region 18 with the ν-type Si body 12. An n-type conductivity control layer 22 extends a distance into the Si body 12 from those portions of the surface 14 other than that from which the p-type region 18 extends. The n-type control layer 22 may include a portion 22a which extends into the Si body 12 from that portion of the surface 14 from which the p-type region 18 extends. The relative concentration of the p- and n-type conductivity modifiers is such that the region 22a is p-type conducting. A passivation layer 24, overlies the surface 14 of the Si body 12 and has an opening 26 therethrough over that portion of surface 14 from which the p-type region 18 extends. A first electrical contact 28 overlies a portion of the surface 14 in the region of the opening 26 in the passivation layer 24 and also overlies a portion of the passivation layer 24. An anti-reflection coating 30 overlies the surface 14 in the region of the opening 26 through which light enters the device. An n-type conductivity region 34 extends a distance into the Si body 12 from the opposed surface 16. The second electrical contact 34 overlies the surface 16 of the Si body 12.

The ν-type Si body 12 typically has a resistivity between about 3,000 and about 10,000 Ω-cm and is about 200 micrometers (μm) thick. The p-type region 18 contains an excess concentration of a p-type conductivity modifier, preferably B, and typically extends a distance between about 0.2 and about 0.5 μm into the body. The p-type region 18 has a dimension along the first surface 14 which is greater than the distance which the p-type region 18 extends into the body 12. The n-type control layer 22 contains an excess concentration of an n-type conductivity modifier, preferably As or Sb. The n-type region 34 typically contains a large excess concentration of n-type conductivity modifier, preferably phosphorus (P), so that it is $n^+$-type conducting, and preferably extends a distance between about 0.5 and about 1.0 μm into the body. The passivation layer 24 is preferably composed of $SiO_2$ and is about 0.6 μm thick. The first and second electrical contacts 28 and 34 respectively are composed of about a 50 nanometer (nm) thick Cr layer and about 200 nm thick Au layer sequentially deposited by vacuum evaporation. The first electrical contact 28 need only overlie a portion of the surface 14 in the region of the opening 26. The anti-reflection layer 30 is composed of a transparent material such as SiO having an optical thickness of ¼ wavelength at the wavelength for which the device performance is optimized.

The photodiode of the invention may be fabricated in the following manner. The opposed surfaces 14 and 16 are prepared using polishing and etching techniques well known in the art. The n-type control layer is preferably formed by ion implantation of As or Sb into a surface of the $\nu$-type silicon body to a dose between about 0.5 and $10 \times 10^{12}/cm^2$ and preferably between about 2 and $4 \times 10^{12}/cm^2$ of the surface area implanted. The energy of the implanted ions is typically between about 50 and 150 kilo-electron volts (keV). An $SiO_2$ passivation layer is formed on the same surface by thermal growth in a wet oxygen ($O_2$) atmosphere for 1.5 hours at 1000° C. and an opening is then formed in this layer using standard photolithographic and chemical etching techniques. The amount of the implanted ions remaining in the Si body after the growth of the passivation layer depends upon the energy of the implant and the total dose. It is desirable that between about 0.5 and about $5 \times 10^{12}/cm^2$ and preferably between about 1 and about $2 \times 10^{12}/cm^2$ n-type conductivity modifiers remain in the body. A B-doped glass (BDG), to be used as the B source, is deposited in the opening in the passivation layer by the reaction of silane and diborane in a $O_2$ atmosphere at 400° C. A capping layer of $SiO_2$ is deposited over the BDG to prevent contamination of the furnace. A phosphosilicate glass (PSG) is then deposited on the opposed surface of the Si body from a $POCl_3$ atmosphere at between 900° and 1100° C. The diffusion of both the B and P into the Si body from the source glasses occurs while the body is held in this temperature range. Relatively little diffusion of the As or Sb occurs during this step because the diffusion coefficients of these elements are much less than that of the B or P. The As or Sb in the portion 22a of the control layer is compensated by the B. This fabrication method succeeds since As and Sb have smaller diffusion coefficients than does the B p-type conductivity modifier and is preferred since it requires the minimum number of process steps.

If an n-type conductivity modifier having a higher diffusion coefficient than that of B, such as P, were used in the first instance, the control layer would extend a further distance into the body than the p-type region, thereby forming a junction between the p-type region and n-type control layer. Such a junction would be undesirable because of the resulting high capacitance at low bias voltages.

If a faster diffusing n-type conductivity modifier such as P is to be used in the n-type control layer, a second method must be used to fabricate the device. This method comprises the steps of masking the surface of the Si body from which the p-type region is to extend, implanting P into the remainder of this surface, stripping the mask, forming a mask having an opening therein on the same surface of the Si body, depositing a BDG on the Si body in the opening, diffusing the B to form the p-type region, depositing a P source glass on the opposed surface of the Si body and diffusing the P to form the n-type region.

The invention is illustrated by the following Examples but is not meant to be limited to the details described therein.

EXAMPLE I

Several batches of p-$\nu$-n Si photodiodes having a junction area of about 2 $cm^2$ were prepared by the first method using As as the n-type conductivity modifier in the control layer while varying the implant energy and dose of As implanted. The junction resistance of photodiodes from each batch was measured. The averages of these measurements are listed in the Table.

TABLE

| Energy | Dose | Junction Resistance |
|---|---|---|
| 70 keV | $2 \times 10^{12}/cm^2$ | 6 MΩ |
| 70 keV | $4 \times 10^{12}/cm^2$ | 25 MΩ |
| 100 keV | $2 \times 10^{12}/cm^2$ | 27 MΩ |
| 100 keV | $4 \times 10^{12}/cm^2$ | 20 MΩ |

EXAMPLE II

A batch of p-$\nu$-n Si photodiodes having a junction area of about 2 $cm^2$ was prepared by the second method using P as the control layer dopant with a total dose of about $1 \times 10^{12}/cm^2$ at an implant 100 keV. The average junction resistance of these devices was measured to be about 20MΩ.

COMPARATIVE EXAMPLE

A batch of p-$\nu$-n Si photodiodes was prepared by the first method but without the n-type control layer. The junction resistance of the photodiodes was measured to be between 2 and 4MΩ.

We claim:
1. A photodiode comprising:
   a silicon body having $\nu$-type conductivity with a resistivity greater than 1,000 ohm-cm and first and second major surfaces;
   a continuous p-type conductivity region extending a distance into the body from a portion of the first surface through which light enters the body and having a dimension along said first surface greater than the distance said p-type region extends into the body;
   an n-type conductivity control layer extending a distance into the silicon body from a portion of said first surface contiguous with and around that portion of said first surface from which said p-type region extends;
   an n-type conductivity region extending a distance into the body from said second surface;
   a first electrical contact overlying a portion of said p-type region at said first surface; and
   a second electrical contact overlying at least a portion of said n-type region at said second surface.

2. The photodiode of claim 1 wherein the n-type conductivity control layer contains an n-type conductivity modifier selected from the group consisting of arsenic and antimony.

3. The photodiode of claim 1 wherein the n-type conductivity modifier is present in a total amount of between about $0.5 \times 10^{12}$ and about $5 \times 10^{12}/cm^2$ of surface area from which the control layer extends into the body.

4. The photodiode of claim 3 wherein the total amount is between about $1 \times 10^{12}$ and about $2 \times 10^{12}/cm^2$ of surface area.

5. The photodiode of claim 1 wherein the silicon body has a resistivity greater than about 3,000 ohm-cm.

6. The photodiode of claim 5 wherein the silicon body has a resistivity between about 3,000 and 10,000 ohm-cm.

* * * * *